United States Patent
Kawanishi et al.

[11] Patent Number: 6,086,671
[45] Date of Patent: Jul. 11, 2000

[54] METHOD FOR GROWING A SILICON SINGLE CRYSTAL

[75] Inventors: Souroku Kawanishi, Saga; Youichi Yamamoto, Amagasaki, both of Japan

[73] Assignee: Sumitomo Sitix Corporation, Amagasaki, Japan

[21] Appl. No.: 09/145,417

[22] Filed: Sep. 1, 1998

[51] Int. Cl.[7] .................................................. C30B 15/20
[52] U.S. Cl. .......................... 117/30; 117/32; 117/217; 117/917
[58] Field of Search ................... 117/14, 15, 30, 117/32, 217, 917

[56] References Cited

U.S. PATENT DOCUMENTS

| | | | |
|---|---|---|---|
| 5,196,085 | 3/1993 | Szekley et al. | 117/32 |
| 5,792,255 | 8/1998 | Iino et al. | 117/32 |
| 5,797,990 | 8/1998 | Li | 117/208 |
| 5,851,283 | 12/1998 | Hoshi et al. | 117/32 |
| 5,868,832 | 2/1999 | Begg | 117/32 |

FOREIGN PATENT DOCUMENTS

| | | |
|---|---|---|
| 58-217493 | 12/1983 | Japan . |
| 62-70286 | 3/1987 | Japan . |
| 1-282185 | 11/1989 | Japan . |
| 7-267776 | 10/1995 | Japan . |

*Primary Examiner*—Felisa Garrett
*Attorney, Agent, or Firm*—Armstrong, Westerman, Hattori, McLeland & Naughton

[57] ABSTRACT

A method for melting a silicon starting material can suppress silica (SiO2) from melting out from a quartz crucible wherein the silicon starting material is melted and can provide a high-quality silicon single crystal in a high yield. The growth method comprises melting the silicon starting material charged in the crucible while applying thereto a static magnetic field, contacting a seed crystal to a surface of the silicon melt, and pulling the seed crystal upwardly to solidify the contacted melt. The silicon starting material charged in the crucible, which is under melting, is applied with a static magnetic field such as a Cusp magnetic field, a horizontal magnetic field and/or a vertical magnetic field. The application can control heat convection occurring in the crucible during the course of the melting of the starting material, thereby obtaining a silicon single crystal having a reduced number of dislocation defects.

12 Claims, 6 Drawing Sheets

Fig.3 a. heat convection b. flow forced by rotation of a crystal c. flow forced by rotation of a crucible d. Marangoni-flow

METHOD FOR GROWING A SILICON SINGLE CRYSTAL

FIELD OF THE INVENTION

This invention relates to a method for pulling and growing a highquality silicon single crystal, and more particularly, to a method for melting a silicon starting material which can well suppress silica ($SiO_2$) from melting out from a quartz crucible in which the silicon starting material is melted.

DESCRIPTION OF THE PRIOR ART

For the manufacture of a silicon single crystal, there has been widely used a so-called Czochralski method wherein a highly pure silicon material is melted in an atmosphere of argon under reduced pressure, and a seed crystal is brought into contact with the melt surface and solidified while pulling upwardly.

Figure 1:
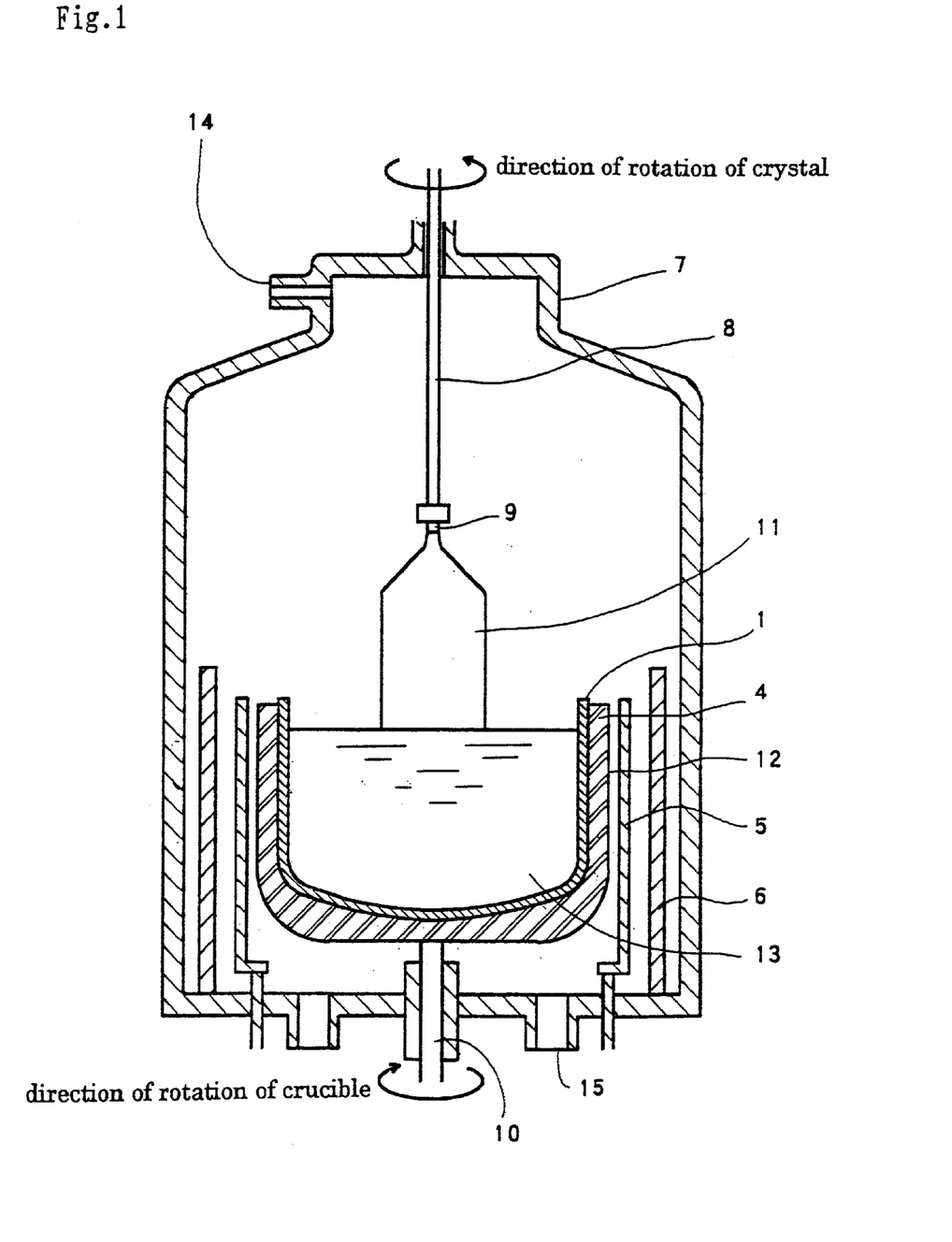
FIG. 1 is a longitudinal sectional view showing an apparatus of growing a silicon single crystal solidified while pulling according to the Czochralski method.

FIG. 1 is a longitudinal sectional view showing an apparatus of growing a silicon single crystal, which is solidified while pulling up according to the Czochralski method. In FIG. 1, a chamber 7 is under reduced pressure and in an atmosphere of pulling silicon single crystal 11. At the center of the chamber, a melting crucible 12 is placed, and a heater 5 constituted, for example, of an induction heating coil and an insulating cylinder 6 made of a heat-insulating material are, respectively, arranged to surround the crucible therewith in this order. A melt 13 of a starting material for crystal growth, i.e. a silicon starting material, which is melted by means of the heater, is accommodated in the melting crucible. A seed crystal 9 attached to the tip of a pulling wire 8 is contacted with the surface of the melt at the lower end thereof, and is pulled upwardly, thereby causing the silicon single crystal to be grown as a result of the solidification of the melt attached to the lower end.

At that time, the melting crucible 12 and the silicon single crystal 11 are, respectively, rotated by means of a rotary shaft 10 and a rotation mechanism (not shown) provided at the upper portion of the pulling wire, in directions opposite to each other. The melting crucible has a double crucible structure constituted of an inner quartz container (hereinafter referred to simply as "quartz crucible") and an outer carbon container 4 (hereinafter referred to simply as "carbon crucible). The reduced pressure of a chamber is reduced to a level of about 10 Torr., to which argon gas is fed from a gas feed port 14 and is discharged from an exhaust port 15 while entraining SiO gas generated from the surface of the silicon melt and CO gas generated from the carbon crucible and the heater.

For the growth of a silicon single crystal, a silicon starting material is charged into the quartz crucible, and heated to high temperatures by means of a heating element and melted to provide a silicon melt. Next, the surface temperature of the melt is appropriately controlled, after which a seed crystal is brought into contact with the melt surface thereby permitting the growth of a crystal. While the seed crystal is pulled, the melt in the crucible is converted to a single crystal. Thus, a silicon single crystal is grown. If the melt is contaminated with foreign matters during the growth of the silicon single crystal, segregation takes place in the crystal, thereby causing dislocation defects to lower the yield of a silicon single crystal.

The occurrence of the dislocation defects is, in most cases, caused by the contamination with foreign matters such as silica melting out from a quartz crucible and the blow-off of bubbles. In order to prevent the occurrence of the dislocation defects, it is necessary to reduce the amount of silica to be melted out from a quartz crucible. For this purpose, there has been adopted a method of controlling an oxygen concentration in a silicon melt by controlling the temperature of the quartz crucible or by controlling the convection in the vicinity of the wall surfaces of the quartz crucible.

It is known that in the melt used during the course of the growth of a silicon single crystal, the convection takes place due to the temperature difference and the flows occur owing to the rotations of the crucible and the single crystal being pulled, and thus, complicated flows are caused at the interface of the growth.

Figure 2:
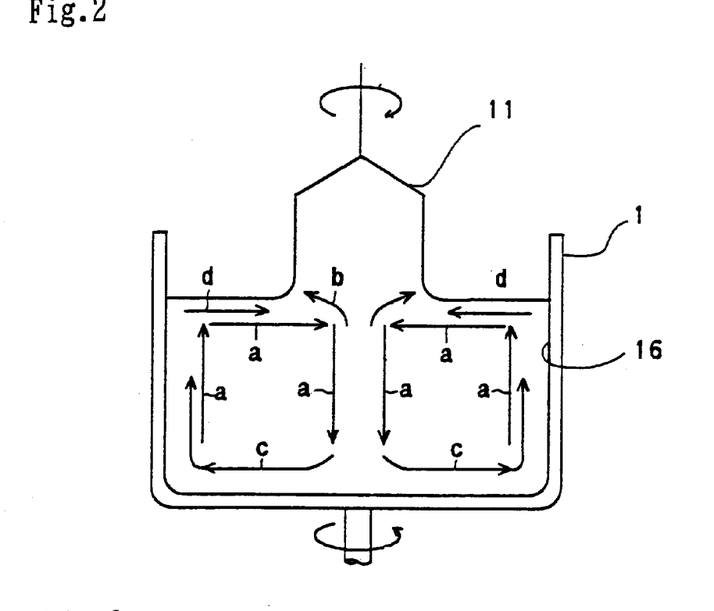
FIG. 2 is a longitudinal sectional view showing the flows of a melt being grown into a silicon single crystal.
Figure 3:
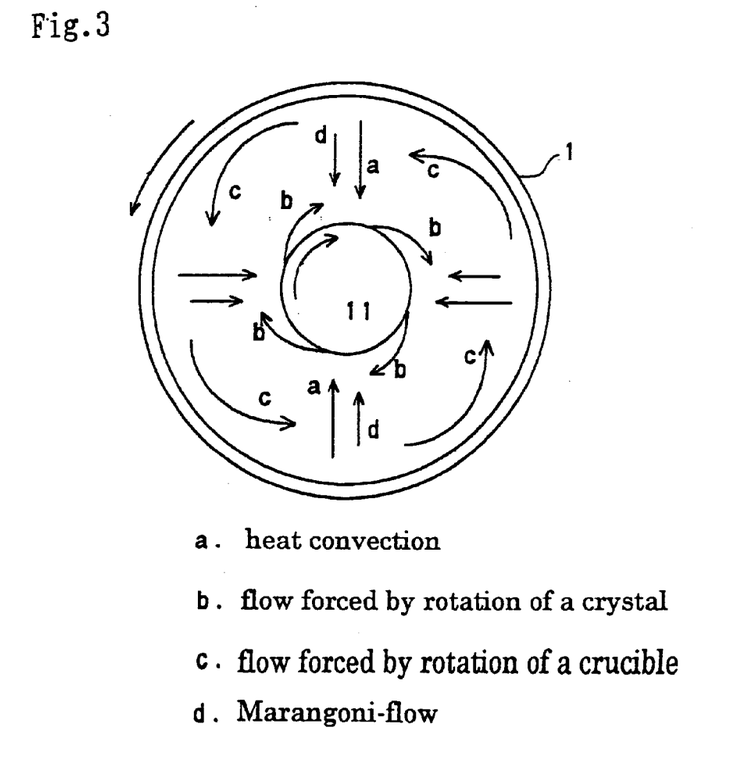
FIG. 3 is a plan view showing the flows of a melt being grown into a silicon single crystal.

FIGS. 2 and 3 are, respectively, views showing the convection of a melt during the growth of a single crystal wherein FIG. 2 is a longitudinal sectional view and FIG. 3 is a plan view. As set out before, the quartz crucible is heated by radiation from the side-wall of the cylindrical heater. In this condition, the melt in the crucible suffers heat convection a, forced flow b caused by the rotation of a single crystal, forced flow c caused by the rotation of the crucible, and Marangoni-flow d occurring only in the surface.

Among these flows, the heat convection influences the uniformity of a temperature distribution of the heat convection a and the ease in the crystal growth rate and the control of a diameter. The heat convection is said to be a state of turbulent flow, and brings about a variation in temperature or growth rate at the growing interface of a crystal thereby causing a non-uniform distribution of impurities and the occurrence of defects. Moreover, the heat convection facilitates the melting out of a quartz crucible (silica) into the melt and increases incorporation of oxygen from the silica into the single crystal.

The forced flow b caused by the rotation of the single crystal is generated in such a way that the crystal is rotated at a rate of 15 to 30 r.p.m. in a direction opposite to the direction of rotation of the crucible to impart the force of inertia to the melt thereby causing the fluid flow. This flow is a turbulence-free laminar flow, and inhibits the turbulent heat convection from entering beneath the crystal growth interface.

The forced flow c caused by the rotation of the crucible is generally caused such that when the crucible is rotated in a direction opposite to the direction of the rotation of the crystal, under which a speed substantially equal to the rotation speed of the crucible is given at the wall surfaces of the crucible as is particularly shown in FIG. 3, thereby creating the flow which suppresses the convection flow.

The Marangoni-flow d is one which is caused owing to the non-uniformity of a surface tension. This flow is smaller than the heat convection and the forced flows of the rotations of the crystal and the crucible, giving little influence on the growth of a silicon single crystal.

In this manner, the flows of the melt have the effect of moving heat and impurities in the melt. The oxygen concentration and the uniformity in distribution of a dopant depend mainly on the magnitude of the heat convection. Accordingly, the magnitude of the flows in the melt should be appropriately controlled for the growth of a silicon single crystal.

If a static magnetic field is applied to during the pulling of a single crystal, the flow of a melt is suppressed, and the oxygen concentration in the melt increases at the interface of the crucible, thereby suppressing melting out of silica from the crucible. This is because oxygen (O) in the melt generates such that $SiO_2$ melts out from the crucible and reacts with the molten silicon (Si) to decompose into SiO and O.

The thus generated SiO and O invariably evaporate from the surface of the melt, and the oxygen concentration in the melt is suppressed to a low level at which oxygen is not saturated in the melt. This eventually leads to the continuous melting out of silica ($SiO_2$) from the quartz crucible (silica). However, when a magnetic field is applied to, the flow parallel to the side-wall of the crucible is suppressed to increase the thickness of a boundary layer at the crucible interface. As a result, the oxygen concentration in the boundary layer increases, thereby reducing the amount of the quartz crucible (silica) being melted out.

Figure 4:
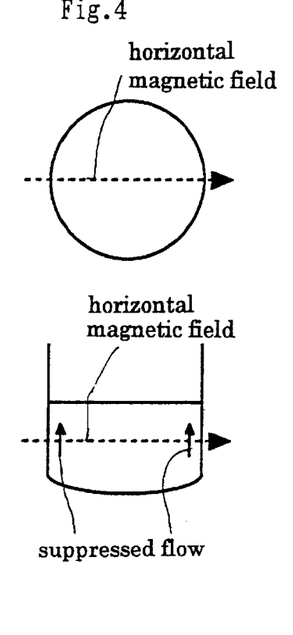
FIG. 4 is a view showing flow suppressed upon application of a horizontal static magnetic field to a melt being grown into a single crystal.
Figures 5, 6:
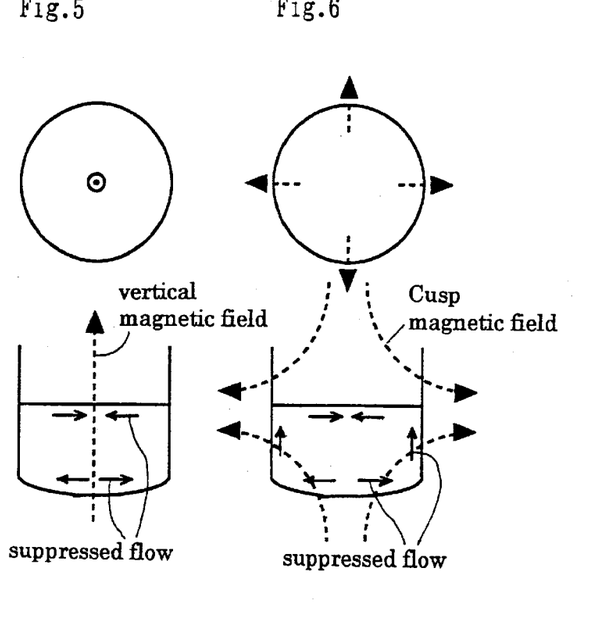
FIG. 5 is a view showing flows suppressed upon application of a vertical static magnetic field to a melt being grown into a single crystal.
FIG. 6 is a view showing flows suppressed upon application of the static Cusp magnetic field to a melt being grown into a single crystal.

FIGS. 4, 5 and 6 are, respectively, views showing flows which are suppressed upon application of a static magnetic field to the melt used for the growth of a single crystal. FIG. 4 is a view illustrating the state of suppressing the flow when a horizontal magnetic field is applied to, FIG. 5 is a view illustrating the state of suppressing the flow on application of a vertical magnetic field, and FIG. 6 is a view illustrating the state of suppressing on application of the Cusp magnetic field. In these figures, the arrows indicated by solid lines, respectively, indicate the direction of a flow, and the arrows indicated by broken lines indicate the direction or directions of a magnetic field.

As shown in FIG. 4, when a horizontal magnetic field is applied to, the ascending flow is suppressed to reduce an amount of silica being melted out from the bottom of the crucible. Where the Cusp magnetic field is applied to as shown in FIG. 6, the flows at the side-wall and bottom of the crucible are suppressed to reduce silica being melted out from the side-wall and bottom of the crucible.

The methods of applying a magnetic field to suppress flows in a melt are proposed, for example, in Japanese Patent Publication No. Hei 2-12920 and Japanese Laid-open Patent Application Nos. Sho 62-70286, Hei 1-282185 and Hei 7-267776.

OBJECT OF THE INVENTION

The technique of controlling flows in a melt according to the above-stated magnetic filed application methods is effected all during the course of the growth or pulling of a single crystal, with some successful results being attained. However, in actual operations, dislocation defects are produced during the pulling of a singe crystal, forcing the interruption of the pulling and the lowering of yield.

An object of the invention is to provide a method for growing a highquality silicon single crystal wherein when a silicon starting material is melted, a magnetic field is applied to the resultant melt to appropriately control heat convection in the melt.

SUMMARY OF THE INVENTION

We made studies on the reduction in amount of foreign matters melted out from a quartz crucible and the blow-off of bubbles, which causes dislocation defects during the pulling of a single crystal, and, as a result, found that when a silicon starting material is melted, silica being melted from a quartz crucible and bubbles being blown off are both great in amount. The invention is accomplished based on this finding.

The subject matter of the invention resides in the following method of growing a single crystal as illustrated with reference to FIG. 8 set out hereinafter.

More particularly, the method for growing a silicon single crystal comprises melting a silicon starting material charged in a crucible while applying a static magnetic field, contacting a seed crystal with a surface of the silicon melt, and solidifying the melt while pulling upwardly.

The term "static magnetic field" used herein is one that is established by application of a steady-state current or by means of a magnet without suffering any change in relation to time and which is able to suppress the flows of the melt.

DESCRIPTION OF THE PREFERRED EMBODIMENTS

The method of the invention is characterized by applying a static magnetic field to a silicon starting material being melted.

We have confirmed that when a silicon starting material is melted, the melting out of silica from a quartz crucible and the blow-off of bubbles are frequently experienced as stated before.

Figure 7:
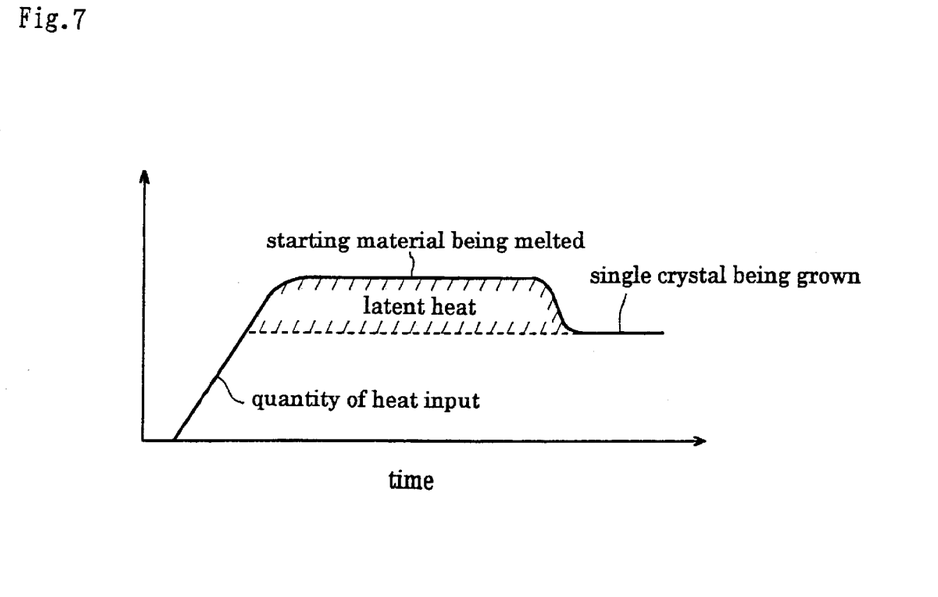
FIG. 7 is a schematic view showing a variation with progress between time, in amount of the heat input from a heater in the course of growth of a single crystal after melting of a silicon starting material.

FIG. 7 is a schematic view showing a variation with progress between time, in amount of the heat input from a heater in the course of growth of a single crystal after melting of a silicon starting material. The heat input from the heater gradually increases till commencement of the melting, and is kept substantially at a given level after the commencement of the melting but before completion of the melting. Once the material has been completely melted, any latent heat (as shown in the figure by oblique lines) is not required for the melting of the starting material, and the amount of the heat input lowers by 10 to 20%. The thus lowered amount of the heat input is used to stabilize the temperature of the melt for the growth of a single crystal, after which pulling starts. The amount of the heat input can be measured from the electric power (product of current and voltage) charged to the heater.

From FIG. 7, we assumed that the temperature of the quartz crucible became higher during the growth of a single crystal than during melting of the starting material, and checked the surfaces of the crucible from which the melt was discharged from the melting of a silicon starting material. As a result, it was found that the thickness of a crystallized layer on the crucible surface differs between the cases where the starting material was melted by application of a static magnetic field and where the material was melted without application of any static magnetic field. More particularly, the thickness became greater for the case where a static magnetic field was applied.

This is considered for the reason that when a static magnetic field is applied, the heat convection is suppressed, so that the thickness of an oxygen melted-out, diffused layer increases in the vicinity of the wall surfaces of the crucible, thereby permitting the crucible surface to be crystallized. More particularly, it is assumed that when the quartz crucible surface undergoes crystallization, the bonding force of the quartz becomes greater, with an attendant advantage that the loss of the crucible by melting is unlikely to occur, thereby facilitating to suppress the separation of the quartz crucible surface and the blow off of bubbles. From this, it was confirmed that the amount of silica being melted out and the amount of blown-off bubbles were greater in the course of melting the starting material, and that in order to reduce dislocation defects in a silicon single crystal, the flows or convection in the crucible during the melting of the starting material should be suppressed so that the amount of silica melted out from the crucible is reduced.

Figure 8:
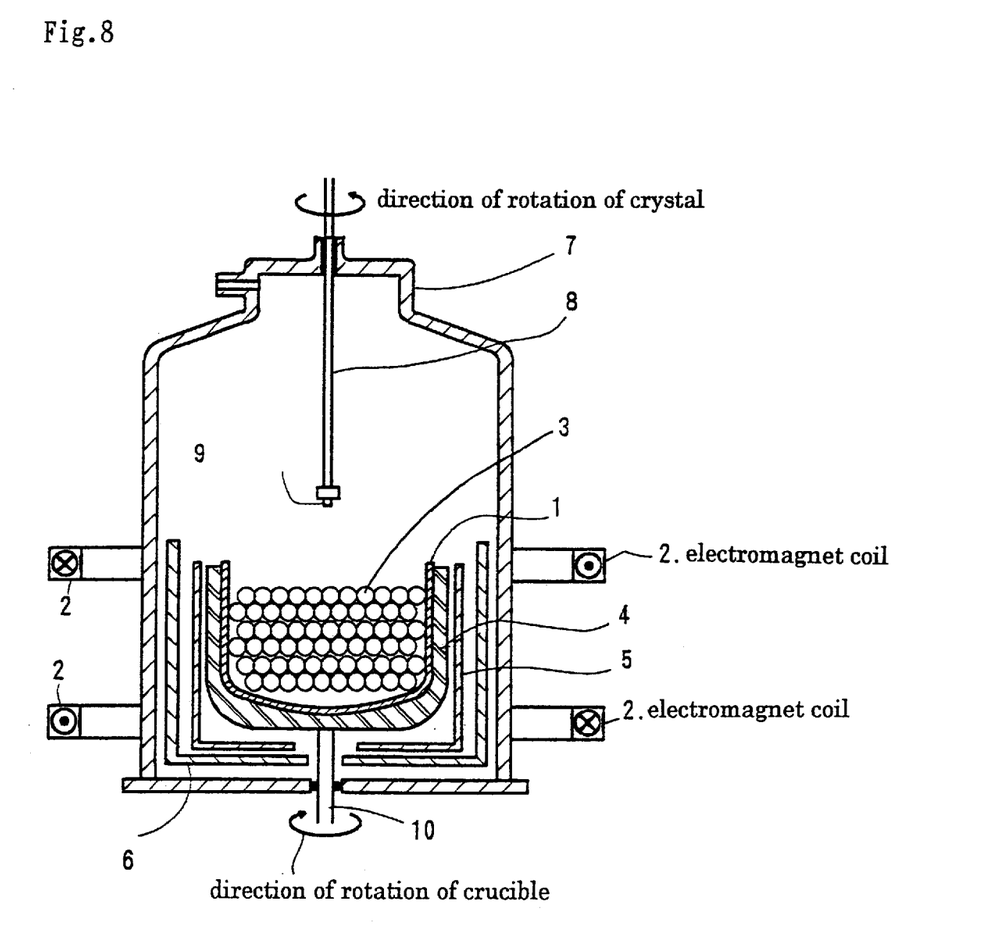
FIG. 8 is a view showing an example of a single crystal manufacturing apparatus for carrying out a method of the invention wherein a silicon starting material is melted while applying the Cusp magnetic field.

FIG. 8 is a view showing an apparatus of growing a single crystal for carrying out the method of the invention wherein a silicon starting material is melted while applying the Cusp magnetic field thereto. In FIG. 8, an electromagnet coil 2 is provided around a quartz crucible 1, and a silicon starting material is charged in the crucible 1.

In accordance with the method of the invention, the silicon starting material 3 is initially fed into the quartz crucible 1 and melted by means of a heater 5. The making time, at which an electric current is applied to the electromagnet coil 2, may be appropriately selected. The current may be applied to from the initial stage of melting the material. Alternatively, the current may be passed after part of the silicon starting material is melted.

Figure 9:
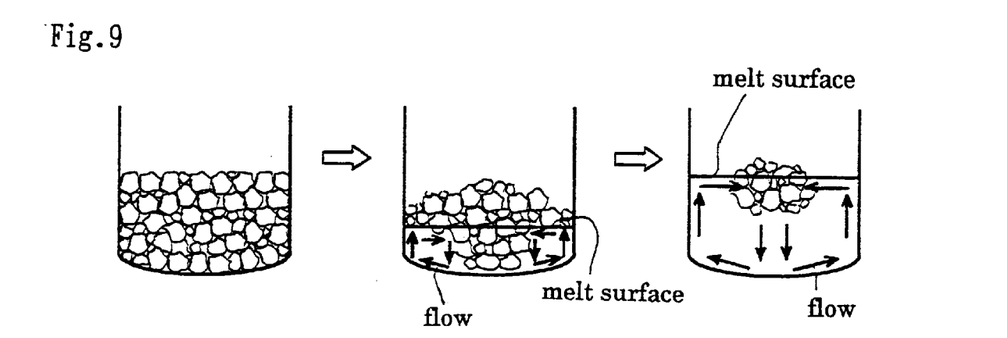
FIG. 9 is a view showing the flow of a melt in case where a silicon starting material is melted in a conventional manner without application of any magnetic field.
Figure 10:
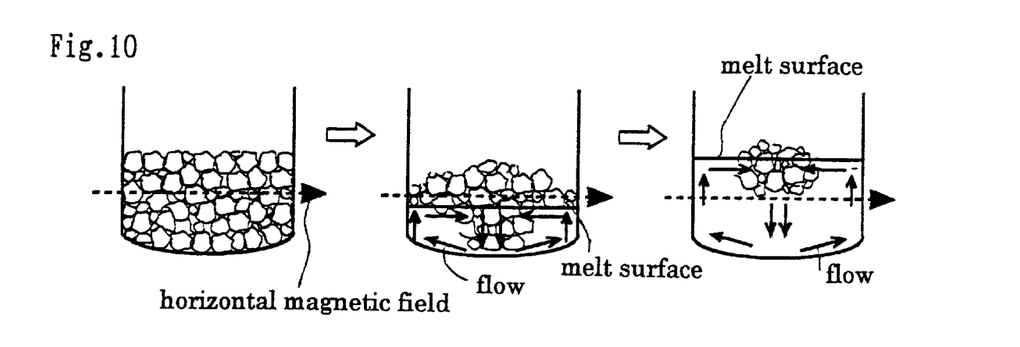
FIG. 10 is a view showing the flow of a melt in case where a horizontal static magnetic field is applied on melting of a silicon starting material.
Figure 11:
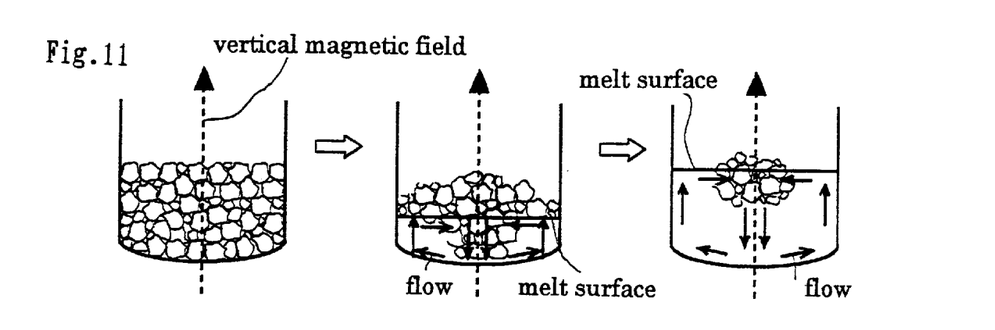
FIG. 11 is a view showing the flow of a melt in case where a vertical static magnetic field is applied on melting of a silicon starting material.
Figure 12:
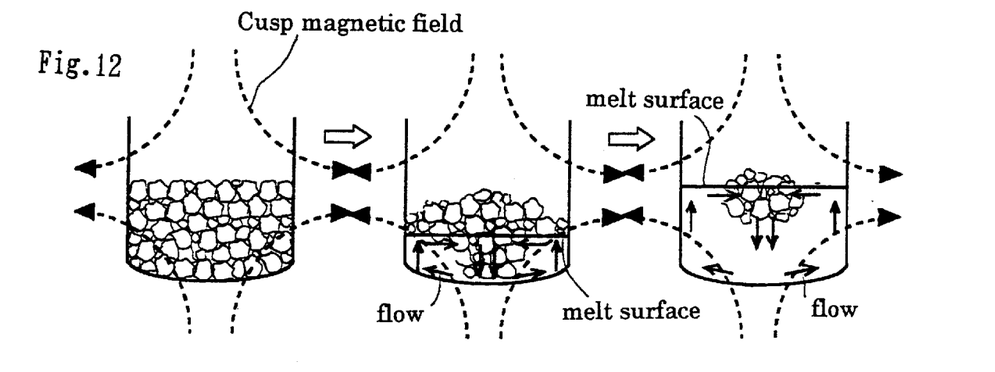
FIG. 12 is a view showing the flow of a melt in case where the Cusp static magnetic field is applied on melting of a silicon starting material.

FIGS. 9, 10, 11 and 12 are, respectively, views showing the flows of the melt when the silicon starting material is melted. More particularly, FIG. 9 is a view illustrating an ordinary melting without application of any magnetic field, FIG. 10 is a view illustrating the case where a horizontal static magnetic field is applied to a melt, FIG. 11 is a view illustrating the case where a vertical static magnetic field is applied to a melt, and FIG. 12 is a view illustrating the flow of a melt when the Cusp static magnetic field is applied thereto. In these figures, the arrows indicated by solid lines, respectively, indicate flow directions, and the arrows indicated by broken lines, respectively, indicate directions of magnetic fields.

Where no magnetic field is applied to a melt as shown in FIG. 9, silica melts out from side-wall and bottom portions due to the flows occurring in the vicinity of the side-wall and bottom portions of the crucible. In this connection, however, when a horizontal magnetic field is applied to as shown in FIG. 10, the flows along the side-wall portions are suppressed, so that the oxygen concentration at the interface with the side-wall portions increases, resulting in the reduction in amount of silica being melted out. Moreover, when a vertical magnetic field is applied to the melting as shown in FIG. 11, the flows along the bottom are suppressed, with the result that the oxygen concentration at the interface with the bottom increases, thus leading to the reduction in amount of silica being melted out. As shown in FIG. 12, when the Cusp magnetic field is applied to melting a silicon starting material, the flows of the melt in contact with the bottom and side-wall portions of the crucible are suppressed. When the flows of the melt are suppressed, oxygen from the silica melted out from the crucible remains at the interface with the crucible. Accordingly, the oxygen concentration becomes high, with a small gradient of the oxygen concentration. In this manner, the amount of silica being melted from the crucible can be reduced, thereby reducing the amounts of foreign matters and bubbles.

EXAMPLES

Example 1

A single crystal pulling test was conducted using an apparatus of growing a silicon single crystal as shown in FIG. 8, wherein 100 kg of polysilicon was melted, while applying thereto the Cusp magnetic field in a manner as shown in FIG. 12.

The test conditions are as shown below.
Intended resistivity of single crystal: 10 Ωcm
Quartz crucible: an inner diameter of 22 inches (560 mm) and a height of 350 mm
Rotation speed of the crucible: 2 r.p.m. during melting, and 8 r.p.m. during growth
Power for heater: 100 kW during melting and 80 kW during growth
Intensity of an applied magnetic field: 400 gausses provided that no magnetic field was applied to during growth
Pulling diameter of single crystal: 6 inches
Pulling length of single crystal: 1300 mm and 1700 mm
Pulling speed of single crystal: 0.6 mm/minute
Rotation speed of single crystal: 15 r.p.m.
Pulling number of single crystals: 10

For comparison, the procedure of melting without application of any magnetic field in a manner as shown in FIG. 9 was also effected under the same conditions as mentioned above. For assessment, the numbers of single crystals having dislocation defects were compared with each other.

When the magnetic field was applied to during the melting of the starting material, the resultant single crystals had no dislocation defect therein for both pulling lengths of 1300 mm and 1700 mm. In contrast, when no magnetic field was applied to for comparison, dislocation defects were found in four single crystals with a length of 1300 mm and seven single crystals with a length of 1700 mm. Moreover, the losses of silica by melting were compared by discharging a melt after the growth of single crystals and measuring a change in weight of the quartz crucible prior to and after the growth. As a result, it was found that the loss was found to be 500 g in case where no magnetic field was applied to for comparison, whereas the loss was reduced to 150 g when the magnetic field was applied to according to the invention.

Example 2

A test was conducted under the same conditions as in Example 1, except that at the time of melting a silicon starting material, the intensity of an applied magnetic field was set at 400 gausses upon commencement of the melting and was changed to 500 gausses 7 hours after the commencement. At the pulling lengths of 1300 mm and 1700 mm, single crystals having dislocation defects were found to be zero in number. Thus, the case where the magnetic field was changed in its intensity in relation to time and the intensity of the magnetic field was changed at long time intervals without adversely influencing the suppression of flows of the melt is within the scope of the invention with respect to the use of static magnetic field.

As described hereinabove, when a silicon starting material is melted while applying thereto a static magnetic field according to the method of the invention, an amount of silica being melted out from a crucible into a melt can be educed, thereby preventing the occurrence of dislocation defects and permitting a high-quality silicon single crystal to be grown in a high yield.

What is claimed is:

1. A method for growing a silicon single crystal which comprises melting a silicon starting material charged in a crucible while applying a static magnetic field, contacting a seed crystal with a surface of the resultant silicon melt, and pulling said seed crystal upwardly to solidify the contacted melt.

2. A method for growing a silicon single crystal according to claim 1, wherein a Cusp magnetic field is applied, as the static magnetic field, to said silicon starting material charged in the crucible, which is under melting.

3. A method for growing a silicon single crystal according to claim 2, wherein an intensity of the magnetic field is at 400 gausses.

4. A method for growing a silicon single crystal according to claim 2, wherein an intensity of the magnetic field is at 400 gausses at the time of commencement of the melting and is changed to 500 gausses.

5. A method for growing a silicon single crystal according to claim 1, wherein a horizontal magnetic field is applied, as the static magnetic field, to said silicon starting material charged in the crucible, which is under melting.

6. A method for growing a silicon single crystal according to claim 1, wherein a vertical magnetic field is applied, as the static magnetic field, to said silicon starting material charged in the crucible, which is under melting.

7. A method for growing a silicon single crystal which comprises melting a silicon starting material charged in a crucible while applying a static magnetic field, contacting a seed crystal with a surface of the resultant silicon melt without further application of any static magnetic field, and pulling said seed crystal upwardly to solidify the contacted melt.

8. A method for growing a silicon single crystal according to claim 7, wherein a Cusp magnetic field is applied, as the static magnetic field, to said silicon starting material charged in the crucible, which is under melting.

9. A method for growing a silicon single crystal according to claim 8, wherein an intensity of the magnetic field is at 400 gausses.

10. A method for growing a silicon single crystal according to claim 8, wherein an intensity of the magnetic field is at 400 gausses at the time of commencement of the melting and is changed to 500 gausses.

11. A method for growing a silicon single crystal according to claim 7, wherein a horizontal magnetic field is applied, as the static magnetic field, to said silicon starting material charged in the crucible, which is under melting.

12. A method for growing a silicon single crystal according to claim 7, wherein a vertical magnetic field is applied, as the static magnetic field, to said silicon starting material charged in the crucible, which is under melting.

* * * * *